United States Patent
Lee et al.

(10) Patent No.: US 7,320,912 B2
(45) Date of Patent: Jan. 22, 2008

(54) TRENCH CAPACITORS WITH BURIED ISOLATION LAYER FORMED BY AN OXIDATION PROCESS AND METHODS FOR MANUFACTURING THE SAME

(75) Inventors: Yueh-Chuan Lee, Nantou (TW); Ming-Sheng Tung, Hualien (TW)

(73) Assignee: PROMOS Technologies Inc., Hsinchu (TW)

( * ) Notice: Subject to any disclaimer, the term of this patent is extended or adjusted under 35 U.S.C. 154(b) by 269 days.

(21) Appl. No.: 11/125,676

(22) Filed: May 10, 2005

(65) Prior Publication Data

US 2006/0255388 A1 Nov. 16, 2006

(51) Int. Cl.
*H01L 21/8242* (2006.01)

(52) U.S. Cl. .............. 438/243; 438/244; 438/245; 438/386; 438/387; 438/388; 257/E29.346

(58) Field of Classification Search ........ 438/243–249, 438/386–392

See application file for complete search history.

(56) References Cited

U.S. PATENT DOCUMENTS

| 5,508,219 A | 4/1996 | Bronner et al. |
| 5,770,484 A | 6/1998 | Kleinhenz |
| 2005/0093044 A1* | 5/2005 | Cheng et al. ............... 257/296 |
| 2006/0105519 A1* | 5/2006 | Davis et al. ................ 438/238 |

* cited by examiner

*Primary Examiner*—Thanh Nguyen
(74) *Attorney, Agent, or Firm*—Akin Gump Strauss Hauer & Feld LLP

(57) ABSTRACT

A method for forming a trench capacitor includes: removing a portion of the substrate to form a trench within the substrate; forming at a buried isolation layer within the substrate; forming in the substrate a first electrode of the trench capacitor at least in areas surrounding a lower portion of the trench; forming a dielectric layer of the trench capacitor; and forming a second electrode of the trench capacitor in the trench. The buried isolation layer intersects with the trench and has one or more gaps for providing body contact between a first substrate area above the buried isolation layer and a second substrate area below the buried isolation layer.

11 Claims, 7 Drawing Sheets

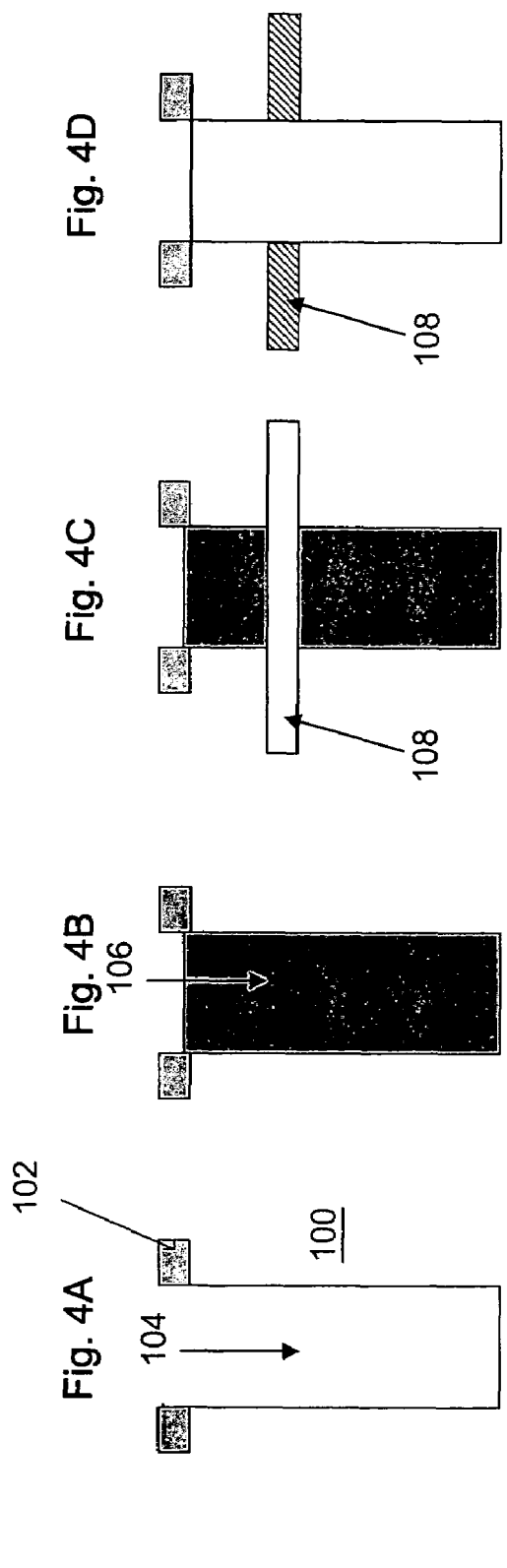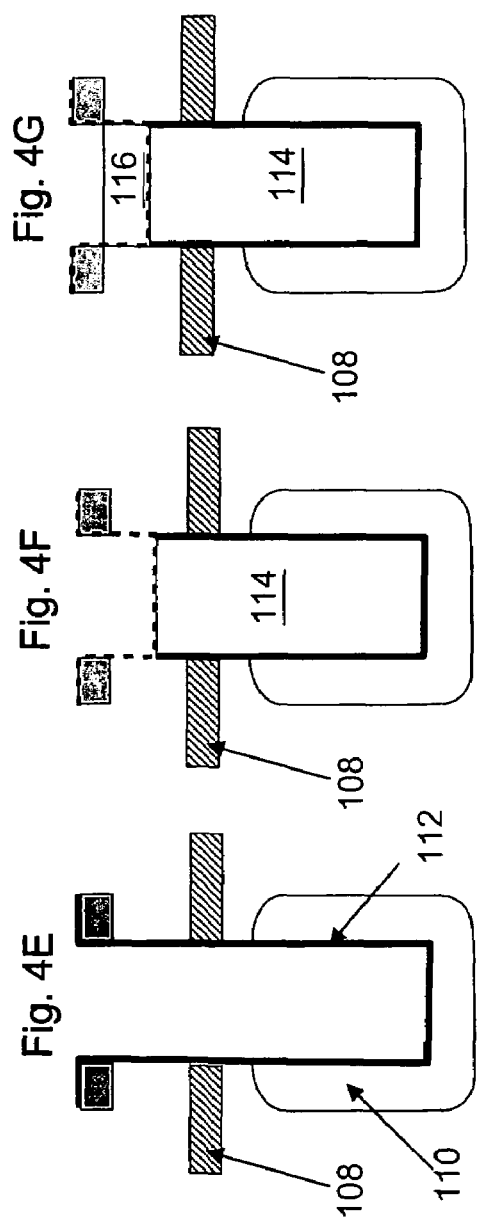

TRENCH CAPACITORS WITH BURIED ISOLATION LAYER FORMED BY AN OXIDATION PROCESS AND METHODS FOR MANUFACTURING THE SAME

BACKGROUND OF THE INVENTION

This invention relates to semiconductor devices, and, more particularly, to trench capacitors with buried isolation layer and methods of forming those trench capacitors.

For integrated circuit ("IC") devices, memory cells are among one of the most important components, either as accompanying components in ICs or as stand-alone devices. In the past two decades, continued researches have been underway to further increase storage capacity per unit area of ICs, improve data retaining time, improve writing and reading speed, and reduce power consumption of memory cells.

Among the various design of memory cells, one major design relies on capacitors as charge storage devices to store data by the charged status of the capacitors. For example, a single dynamic random access memory (DRAM) or synchronous DRAM (SDRAM) cell generally may include a capacitor and a transistor. In some designs, the capacitor may be a single charge storage device for storing one of two or more logical status. The transistor controls the writing and reading of the logical status stored in the capacitor. Depending on the device design and manufacturing process, the transistor may be a field-effect transistor (FET), and frequently, an N-channel field effect transistor (N-FET). To further illustrate the background of the related art without limiting the scope of the invention, the following describes certain examples and memory cell design.

Generally, a capacitor-type memory cell may be one of the three designs: planar, stacked-capacitor, and trench. For a planar design, the transistor and capacitor of a memory cell are provided as planar components. Such design generally requires more area per memory cell than the other two designs, because the planar capacitor and transistor usually occupy separate areas on a semiconductor substrate. In the stacked-capacitor design, the capacitor and transistor of a memory cell are "stacked" up to reduce the substrate area occupied by each cell. In the trench design, the capacitor, the transistor, or both of them in a memory cell may be placed in a substrate, usually by forming the part of cell or the entire cell in a trench or a recessed area of the substrate. Due to such design, trench design approach allows the memory cells to be formed without occupying too much substrate area and allows the formation of other devices or circuitry, such as circuitry for controlling the memory operation, above the memory cells.

Although trench design may provide a higher density of memory, the increasing density of trench devices also leads to significant leakage concerns. Accordingly, there are needs for trench capacitor design having reduced leakage and for methods of manufacturing trench capacitors having reduced leakage.

BRIEF SUMMARY OF THE INVENTION

In one example, a method for forming a trench capacitor in a substrate is provided. The method includes: removing a portion of the substrate to form a trench within the substrate; forming at a buried isolation layer within the substrate; forming in the substrate a first electrode of the trench capacitor at least in areas surrounding a lower portion of the trench; forming a dielectric layer of the trench capacitor; and forming a second electrode of the trench capacitor in the trench. In particular, the buried isolation layer intersecting with the trench may have one or more gaps for providing body contact between a first substrate area above the buried isolation layer and a second substrate area below the buried isolation layer. In addition, the dielectric layer in one example may cover a surface of the trench at least for the portion below the buried isolation layer.

In another example, a method for forming a trench capacitor in a substrate is provided. The method includes: removing a portion of the substrate to form a trench within the substrate; forming a buried isolation layer within the substrate, the buried isolation layer intersecting with the trench and providing a gap for providing body contact in the substrate; forming in the substrate a first electrode of the trench capacitor at least in areas surrounding a lower portion of the trench; forming a dielectric layer of the trench capacitor, the dielectric layer covering a surface of the trench at least for the portion below the buried isolation layer; forming a second electrode of the trench capacitor in the trench; forming a conductive plug on top of a portion of the second electrode; forming a trench isolation region over the second electrode and the conductive plug; and forming a conductive junction in a portion of the substrate to couple the second electrode to a drain area of a transistor.

In another example, a trench capacitor in a substrate is provided. The trench capacitor includes: a trench within the substrate; a buried isolation layer within the substrate and intersecting with the trench; a first electrode of the trench capacitor disposed at least in areas surrounding a lower portion of the trench; a dielectric layer of the trench capacitor, the dielectric layer covering a surface of the trench at least for the portion below the buried isolation layer; and a second electrode of the trench capacitor in the trench. In particular, the buried isolation layer may have one or more gaps for providing body contact between a first substrate area above the buried isolation layer and a second substrate area below the buried isolation layer.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIGS. 4A-4G are schematic cross-sectional diagrams for illustrating the examples of forming a trench capacitor consistent with the present invention.

DETAILED DESCRIPTION OF THE INVENTION

Examples consistent with the invention provide trench capacitors with a buried isolation layer. In some examples, the buried isolation layer replaces the conventional collar structure used in deep trench capacitors for reducing leakage. The use of buried isolation layer may provide better isolation effect, reduce leakage, and/or provide good charge retention characteristics in some examples. Examples consistent with the invention also provide methods of providing trench capacitors with buried isolation layer. In some examples, the buried isolation layer may be formed by implanting certain dopants, such as oxygen or nitrogen, into a substrate for forming a dielectric structure and providing insulative isolation.

In some examples, the manufacturing methods may avoid creating interfaces between the conductive elements of a trench memory cell, such as the interfaces between two or more polysilicon structures used in collar-type trench capacitor. By removing the collar formation process, the memory device may avoid having the potentially undesirable residue of dielectric materials exist between the interface area of two conductive layers. Furthermore, some examples of the manufacturing process may reduce the number of the processing steps in forming the trench capacitor, thereby reducing the manufacturing cost, the manufacturing time.

Figure 1:
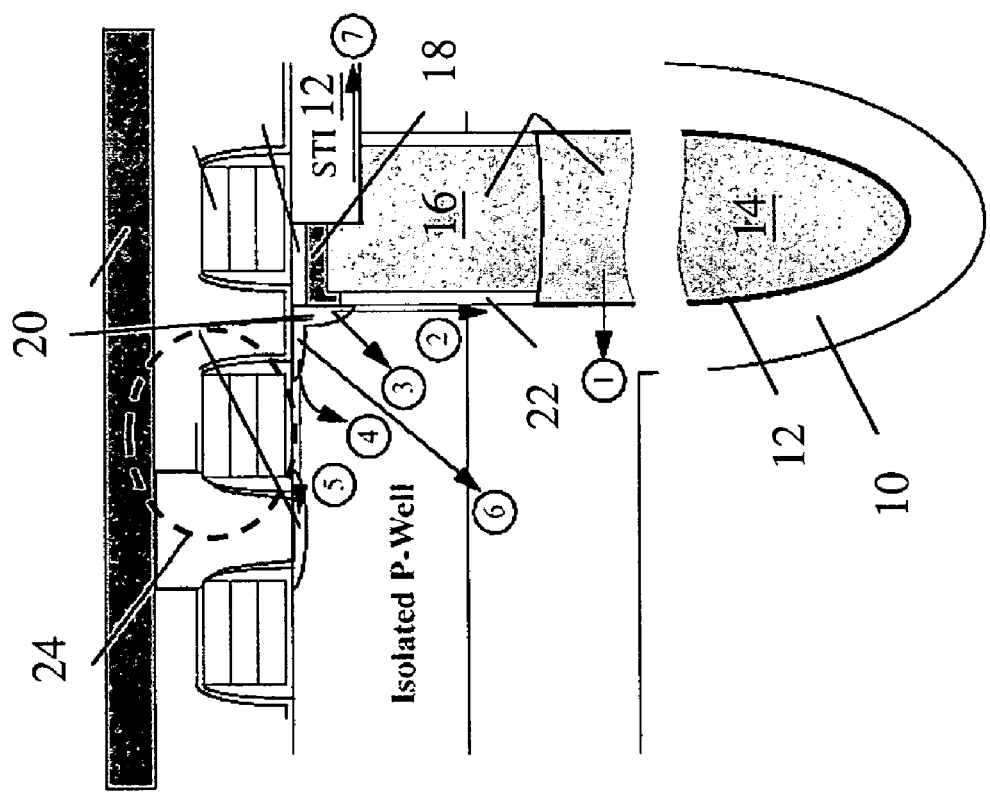
FIG. 1 is a schematic cross-sectional view of a possible design of a memory cell with a trench capacitor in the prior art.

FIG. 1 is a schematic cross-sectional view of a possible design of a memory cell with a trench capacitor in the prior art. Referring to FIG. 1, the trench capacitor may have first electrode 10, dielectric layer 12, second electrode 14, first conductive plug 16, second conductive plug 18, junction region 20, and insulative collar 22. In this example, transistor 24 has its drain region coupled to the trench capacitor formed by first electrode 10, dielectric layer 12, and second electrode 14. The design may have several leakage paths. For example, referring to FIG. 1, those leakage paths may include one or more of the following: node to plate leakage path (1), vertical parasitic leakage path (2), junction leakage path (3), gate-induced drain leakage (GIDL) path (4); sub-threshold leakage path (5); VRT (variable retention time) leakage path;(6); and shallow trench isolation ("STI") leakage path (7).

Figure 2:
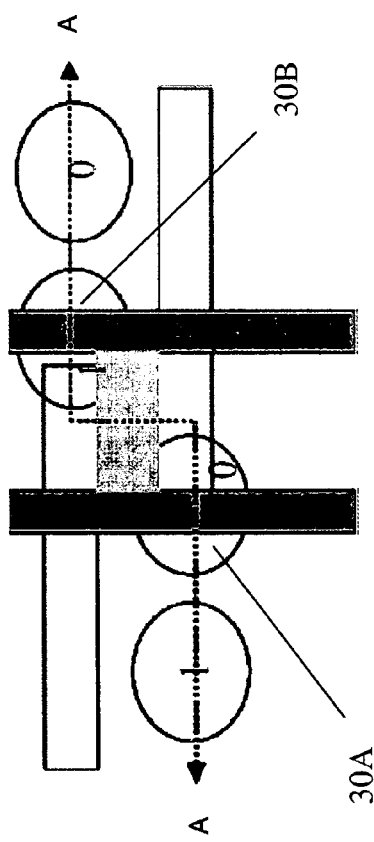
FIG. 2 is a schematic top view of a possible memory cell arrangement along two separate bit lines and two separate word lines over a substrate in the prior art.
Figure 3:
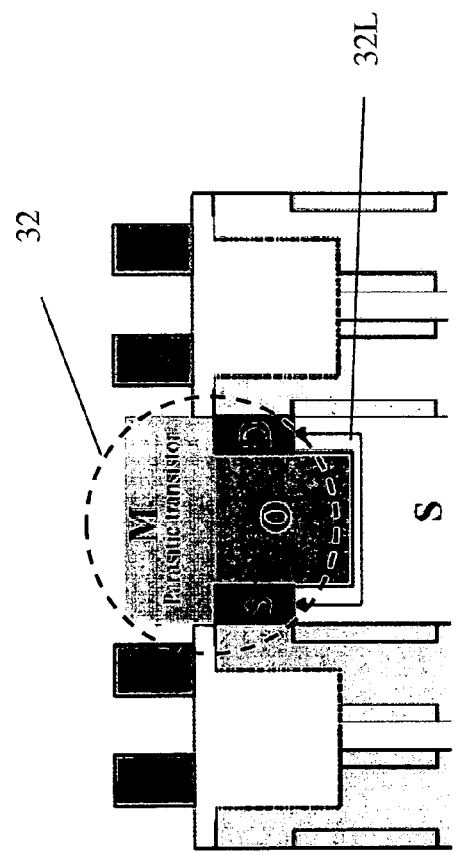
FIG. 3 is a schematic cross-sectional view along the line A-A in FIG. 2 to illustrate a possible parasitic transistor and the associated leakage path in the prior art.

FIG. 2 is a schematic top view of four memory cells in two separate bit lines and two separate gate lines over a substrate. FIG. 3 is a schematic cross-sectional view of four memory cells along the line A-A in FIG. 2 to illustrate a parasitic transistor and associated leakage path. Referring to FIG. 2, when two neighboring memory cells 30A and 30B store different logical status, a parasitic transistor may exist between the two junctions respectively corresponding to memory cells 30A and 30B. FIG. 3 illustrates an example of parasitic transistor 32 and a possible leakage path 32L because of the voltage differences between those two junctions. Therefore, according to the illustrations of FIGS. 1-3, the approach of using trench capacitor with the collar design may cause one or more leakage problems. Although a longer and thicker collar may be used to mitigate leakage concerns, the increased dimension of collar can inhibit the downsizing of trench memory devices. Therefore, the traditional trench capacitor design may not provide sufficient capacitance for the trench capacitor and sufficient 1 (saturation current of transistor) due to leakage effects and other limitations.

As noted above, examples consistent with the invention provide trench capacitors with a buried isolation layer and methods for providing trench capacitors with buried isolation layer. The following paragraphs will describe the examples of forming the trench capacitors, followed by the description of exemplary structures.

FIGS. 4A-4G are schematic cross-sectional diagrams for illustrating the examples of forming a trench capacitor. For a clear illustration of exemplary manufacturing processes, only one trench device is shown in those diagrams. However, in the actual manufacturing process, multiple, such as millions or billions of, trench devices can be simultaneously manufactured within the same semiconductor substrate via the same process or similar processes to provide duplicated or similar structures.

Referring to FIG. 4A, in one example, to form a trench capacitor in semiconductor substrate 100, a portion of substrate 100 may be removed to form trench 104 within substrate 100. In some examples, trench 104 may be provided using an etching process, such as an anisotropic or plasma-enhanced etching process with a mask for defining the trench area. In one example, substrate 100 may be a single-crystal silicon material for forming semiconductor devices therein and thereon. In some examples, substrate 100 may be slightly doped with p-type or n-type dopants in certain areas to provide the desired P or N well regions. Before providing trench 104, an insulating layer 102, such as a pad silicon nitride layer, may be formed over substrate 100 for isolating substrate 100 from the devices to be formed thereon. In one example, the mask used to define the pad silicon nitride layer may be used to define the trench area, thereby simplifying the lithography process for defining the pad silicon nitride and trench regions.

Referring to FIGS. 4B and 4C, after providing trench 104, buried isolation layer ("BIL") 108 may be formed within substrate 100. To adequately define where BIL 108 is to be formed, a lithography process may be used. For example, photoresist layer 106 may be used to cover certain areas on substrate 100 to avoid the formation of BIL 108 on those areas. In some examples, one or more of array areas, buffer capacitor areas, peripheral circuit areas, and other IC areas, may be covered to avoid forming BIL in the corresponding areas of substrate 100. In one example, the mask for defining BIL 108 may be an inverse CB or an inverse GA pattern in the array area. In one example, the CB and GA patterns are respectively defined by the mask for bit line contact formation and the mask for bit line contact halo implantation. In other words, the GA pattern may be used for implanting or providing impurities in the substrate area near or beneath the bit line contact.

Referring to FIG. 4B, the PR may also fill trench 104 to avoid the formation of BIL 108 underneath trench 104 if an implantation approach is used.

In some examples, BIL 108 may be formed by implanting oxygen or nitrogen in at least a portion of substrate 100 surrounding trench 104, as illustrated in FIG. 4C. In one example, BIL 108 may be doped with oxygen at the level of about $10^{17}$ cm$^{-2}$ to $10^{19}$ cm$^{-2}$, such as $1.8 \times 10^{18}$ cm$^{-2}$, or doped with nitrogen at the level of about $10^{17}$ cm$^{-2}$ to $10^{20}$ cm$^{-2}$. The implantation technique for forming BIL 108 provides the flexibility of varying the depth and the location of BIL 108 by adjusting the implantation process. In one example where trench depth is about 7 to 8 μm, BIL 108 may locate in a location of about 0.2-0.3 μm from the surface of substrate 100. Alternatively, BIL 108 may be formed before providing insulating layer 102 and trench 104. However, part of BIL 108 will then need to be removed during the process of removing portions of substrate 100 for forming trench 104.

Figure 5A:
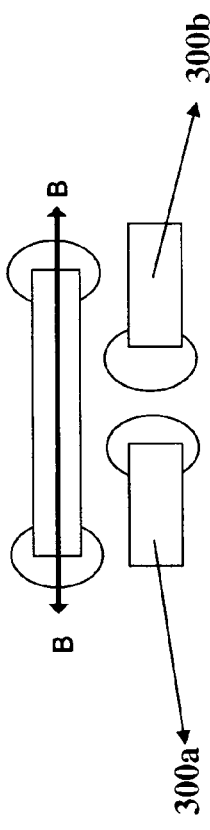
FIG. 5A is a schematic top view of a substrate having four trench capacitors in examples consistent with the present invention.
Figure 5B:
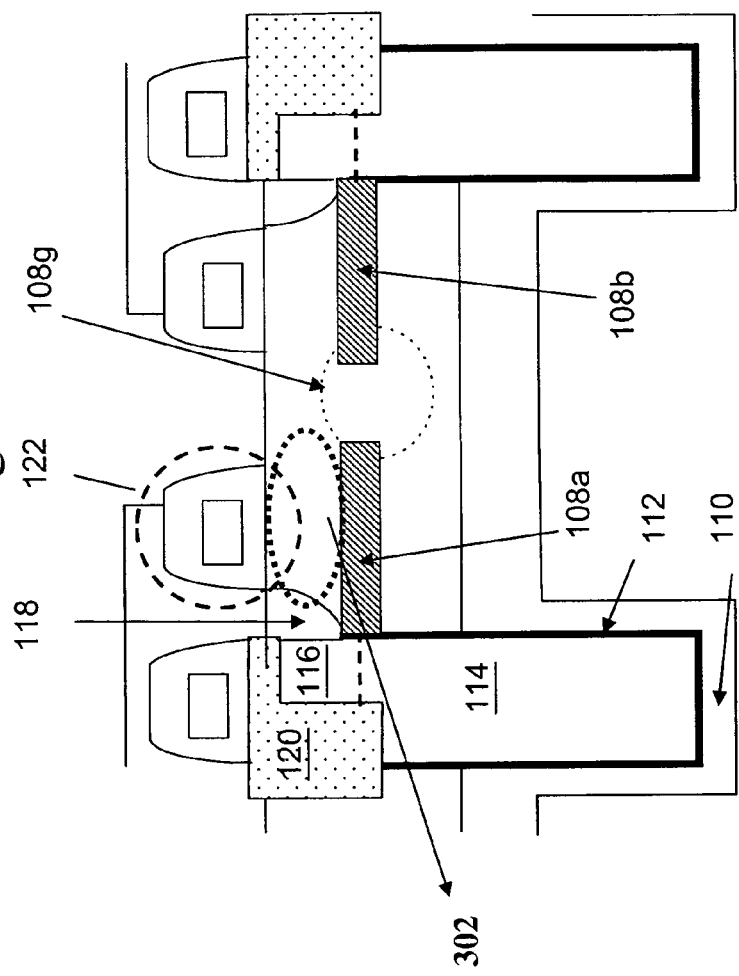
FIG. 5B is a schematic diagram of a cross-sectional view of two exemplary trench memory cells along the B-B line in FIG. 5A.

In some examples, BIL 108 may provide one or more gaps to provide body contact between the substrate area above the buried isolation layer and the substrate area below the buried isolation layer. In one example, the buried isolation regions may be provided by a single isolation layer that has one or more gaps for providing body contact. FIG. 5B illustrates an example of providing gap area 108g in a buried isolation layer, which may be a single region with one or more gaps or a combination of two or more buried isolation regions 108a and 108b to provide body contact through gap area 108g. In the example illustrated in FIG. 5B, one or more gaps may be placed in certain areas under part of bit lines or active areas. In one example, providing one or more gaps in BIL 108 may further include implanting at least the gap areas, and sometime its surrounding area, with p-type dopants to provide a p+ region.

Referring to FIG. 4D, after the oxygen or nitrogen implantation, photoresist 106 may be removed. An anneal process may be performed to form a silicon oxide layer as BIL 108 in substrate 100. In one example, the anneal process may be performed at a temperature between about 1100 to 1200° C., such as 1175° C. in a nitrogen environment for about 3 to 5 hours. Such approach for forming BIL 108 may be referred as SIMOX (Separation by IMplanted OXygen).

Referring to FIG. 4E, after forming BIL 108, first electrode 110 of the trench capacitor may be formed at least in the areas surrounding the lower portion of trench 104. In some examples, first electrode 110 may be formed by doping those areas to increase their conductivity or to make those areas become a conductive plate and serve as an electrode of a capacitor. In one example, such doping may be achieved by forming a diffusion layer, such as an arsenic silicate glass (ASG) or phosphosilicate glass (PSG) layer, conformally with the inner wall of the lower portion of trench 104. Alternatively, a boron-containing layer may serve as the diffusion layer. In some examples, an anneal process may then be used to diffuse the dopants from the ASG or PSG layer to those areas for forming first electrode 110. After the anneal process, the diffusion layer may be removed by an etching process.

Referring again to FIG. 4E, after forming first electrode 110, dielectric layer 112 of the trench capacitor may be formed. In one example, dielectric layer 112 may cover the surface area of trench 104 at least for the portion below BIL 108, as illustrated in FIG. 4F. In one example, dielectric layer 112 may extend through the inner wall of trench 104 to a level higher than the position of BIL 108. As an example, a silicon oxynitride layer may be formed conformally with the trench's inner wall through a deposition process, such as a chemical vapor deposition ("CVD"). The portions of the silicon oxynitride layer not covering the lower and the middle part of the trench, as illustrated in FIG. 4E, may be removed through an etching process after the deposition process. Alternatively, the unneeded portions of silicon oxynitride layer may be removed after the formation of second electrode 114 discussed below, thereby providing a simplified etch process control without the need for a mask. In addition to silicon oxynitride, other dielectric materials, such as silicon oxide, silicon nitride, or their combination, may be used as dielectric layer 112. In one example, the silicon oxynitride layer may be formed by deposing a silicon nitride layer covering the inner wall of trench 104 and oxidizing the silicon nitride layer.

Referring again to FIG. 4F, after forming dielectric layer 112, second electrode 114 of the trench capacitor may be formed in substrate 100, or in trench 104 in particular. In some examples, forming second electrode 114 may include forming a conductive material contiguously with dielectric layer 112. In some examples, second electrode 114 may include a polysilicon layer formed contiguously with dielectric layer 112 or a polysilicon plug that fills at least a portion of trench 104, as illustrated in FIG. 4F. In one example, the polysilicon layer or plug may be formed by a deposition process, such as a CVD or an LPCVD (low pressure CVD) process. If necessary, the deposition process may be followed by an etching process to remove polysilicon materials on other areas and/or an etching-back process to control the depth of second electrode 114 in trench 104. For forming second electrode 114, other conductive materials, such as tungsten, molybdenum, and metallic silicide, may be used.

Referring again FIG. 4F, in forming second electrode 114, another conductive plug or layer 116 may be formed over at least a portion of second electrode 114. FIG. 5B is a schematic diagram of a cross-sectional view of an exemplary trench memory cell along the B-B line in FIG. 5A, which is a schematic top view of a substrate with four trench capacitors. Referring to FIG. 5A, the rectangular areas shown are the active areas of the memory array. For example, 300a and 300b are two active areas. In one example, the top two trench capacitors belong to the same bit line, and the bottom two trench capacitors belong to another bit line. Accordingly, the B-B line extends along a bit line of a memory array in this example.

Referring to FIG. 5B, conductive plug 116 may be formed over a portion of second electrode 114 to electrically couple second electrode 114 to a corresponding transistor. In some examples, conductive plug 116 may include a polysilicon plug, which may be formed by a deposition process, such as a CVD or an LPCVD (low pressure CVD) process. Similarly, the deposition process may be followed by an etching process to remove polysilicon materials on other areas and/or an etching-back process to control the depth of conductive plug 116 in trench 104. For forming conductive plug 116, other conductive materials, such as tungsten, molybdenum, and metallic silicide, may be used. In some examples, conductive plug 116 and second electrode 114 may be formed without intermediate layer or process between the two and, therefore, may provide a desirable interface with good conductivity. In one example, the body of a transistor is illustrated as area 302 illustrated in FIG. 5B. In some examples, due to the BIL 108 having at least one gap, the body of transistor is non-floating, and this may improve the retention time of the capacitor in the memory array.

Referring to FIG. 5B, in some examples, conductive junction 118 may be formed in substrate 100 to couple second electrode 114 to a corresponding transistor, such as the drain area of transistor 122. Conductive junction 118 may be formed by doping a portion of substrate 100 to provide the electrical coupling from second electrode 114 or conductive plug 116 to the drain region of a corresponding transistor. In one example, a dopant implantation or diffusion process may be used.

Referring again to FIG. 5B, a trench isolation region 120, such as a shallow trench isolation (STI) may be formed over second electrode 114 and/or the conductive layer 116 to serve as an insulative isolation, which allows the formation of other devices, such as transistors, over trench capacitors. Trench isolation region 120 may be formed of silicon oxide, silicon nitride, or any insulative materials or their combinations. And a deposition process such as CVD may be used for forming trench isolation region 118.

Referring to FIG. 5B, in one example, a trench capacitor in a substrate may include trench 104 within the substrate 100 and buried isolation layer 108 within substrate 100. As shown in FIG. 5B, BIL 108 may intersect with trench 104 and may have gap 108g for providing body contact between the substrate area above BIL 108 and the substrate area below BIL 108. In addition to BIL 108, the trench capacitor also includes first electrode 110 of the trench capacitor disposed at least in areas surrounding a lower portion of trench 104; dielectric layer 112 covering the inner wall of trench 104 at least for the portion below BIL 108; and second electrode 114 in the trench.

Figure 6A:
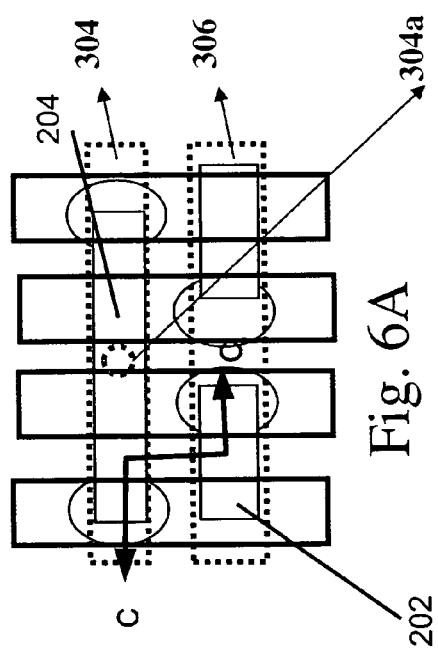
FIG. 6A is a schematic top view of a substrate having four trench capacitors and four separate gate lines in examples consistent with the present invention.
Figure 6B:
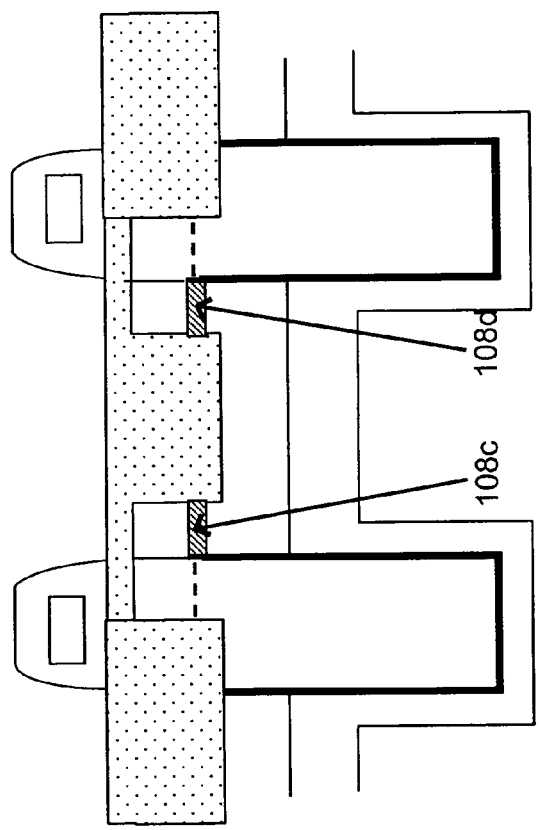
FIG. 6B is a schematic diagram of a cross-sectional view of two exemplary trench memory cells along the C-C line in FIG. 6A.

FIG. 6A is a schematic top view of a substrate having four trench capacitors arranged along two bit lines and four gate lines. In one example, two bit lines 304 and 306 are arranged along a horizontal direction and the four gate lines are arranged in a direction perpendicular to the bit lines. As an example, a bit line contact 304a to bit line 304 may be formed in the middle of bit line 304 between two neighboring gate lines. To illustrate the isolation effect of BIL 108 in one example, FIG. 6B illustrates a schematic diagram of a cross-sectional view of two exemplary trench memory cells along the C-C line in FIG. 6A. Referring to FIG. 6B, in this example, buried insulation regions 108c and 108d provide no gap for body contact in the substrate area between parallel bit lines 304 and 306. As a result, a potential leakage, such leakage though a leakage path caused by a parasitic transistor, is less likely to occur. Therefore, the charge retention characteristics of memory cells may be improved and the interference between neighboring cells may be reduced.

Referring again to FIG. 5B, in addition to the above-mentioned elements, the trench capacitor may also include conductive plug 116 on top of second electrode 114 or a portion of it; a trench isolation region 120 over second electrode 114 and conductive plug 116; and conductive junction 118 in a portion of substrate 100 to couple second electrode 114 to a drain area of a transistor.

Figure 7A:
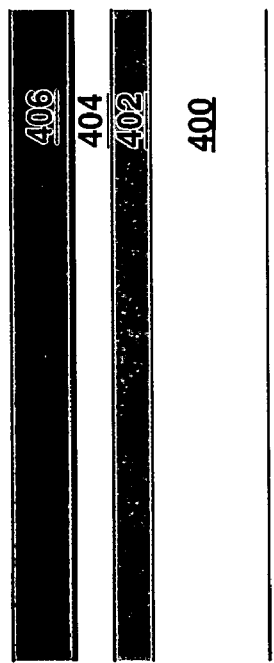
FIGS. 7a-7e are schematic cross-sectional diagrams for illustrating an alternative process for providing a buried isolation layer in examples consistent with the present invention.
Figure 7B:
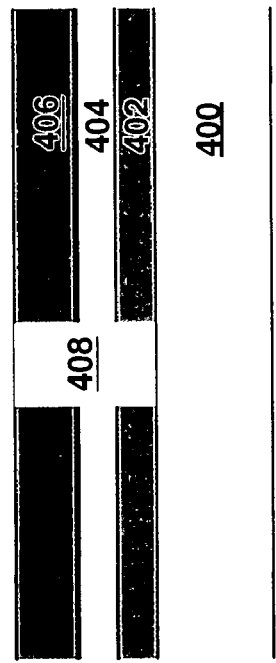

In some examples, an alternative process may be used for providing a buried isolation layer. FIGS. 7a-7e illustrates an alternative process for providing a buried isolation layer. Referring to FIG. 7a, first epitaxial layer 402, such as an epitaxial Si—Ge layer, may be formed on substrate 400, which may be a semiconductor or silicon substrate. Second epitaxial layer 404, such as an epitaxial Si layer, may be formed on first epitaxial layer 402. A patterning process may be used to define a gap or body contact area. In one example, the pad oxide and nitride layer formed as a part of a trench-capacitor-formation process may be used as a hard mark. For example, pad layer 406, such as a combination of an interface silicon oxide layer and a silicon nitride layer, may be formed on second epitaxial layer 404. Referring to FIG. 7b, pad layer 406 may be used as a hard mask for etching a portion of first epitaxial layer 402 and second epitaxial layer 404 to define gap area 408.

Figure 7C:
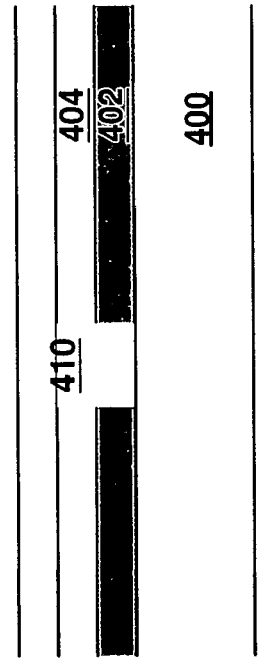
Figure 7D:
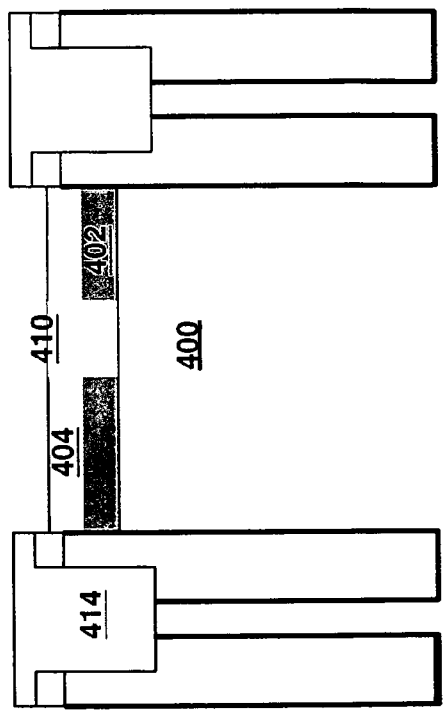

Referring to FIG. 7c, pad layer 406 for the region depicted may be removed after the patterning process. And third epitaxial layer 410, such as an epitaxial Si layer, may be formed on second epitaxial layer 404 and in gap area 408. In one example, the thickness of the epitaxial materials above the first epitaxial layer 402 may be about 0.2 to 0.3 µm. Referring to FIG. 7d, trench capacitors may be formed in substrate 400 and then shallow trenches 414 are formed for isolating the trench capacitors and exposing a portion of the first epitaxial layer 402. In some examples, the process for forming the trench capacitors noted above or its variations may be used.

Figure 7E:
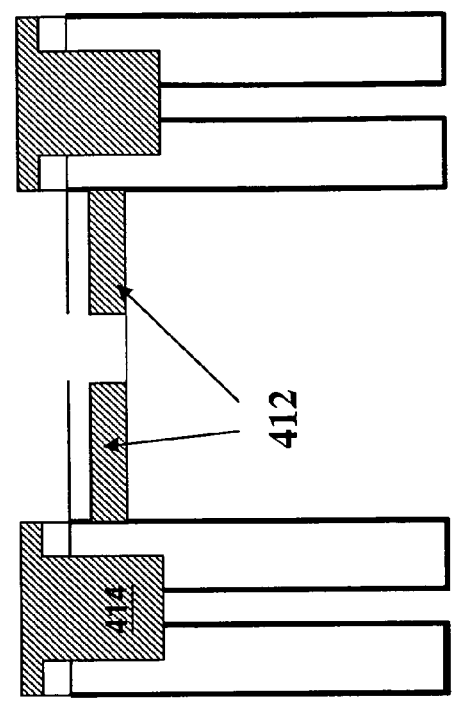

Referring to FIG. 7e, to provide the buried isolation layer, first epitaxial layer 402 may be removed as a part of the trench capacitor formation process in some examples. For first epitaxial layer 402, using a material distinctive from substrate 400 and second epitaxial layer 404 allows selective removal of first epitaxial layer 402, such as through a wet etch process. Following the removal, a thermal process, such as an RTO (rapid thermal oxidation) process, may be used to form a liner oxide in or near the space provided by removing first epitaxial layer 402. In one example, the liner oxide may be formed by oxidizing a portion of substrate 400 and a portion of second epitaxial layer 404. Afterward, high density plasma oxide is filled in the shallow trench 414. As a result, buried isolation layer 412, such as a buried silicon oxide layer, may be provided in a substrate area, which may include substrate 400, second epitaxial layer 404, third epitaxial layer 406, and the body contact provided by third epitaxial layer 406.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for forming a trench capacitor in a substrate, the method comprising:

removing a portion of the substrate to form a trench within the substrate;

forming at least one buried isolation layer within the substrate, the buried isolation layer intersecting with the trench and having at least one gap providing body contact between a first substrate area above the buried isolation layer and a second substrate area below the buried isolation layer, the step of forming the at least one buried isolation layer within the substrate further including:

a) forming at least a first epitaxial layer over the substrate;

b) forming at least a second epitaxial layer over the first epitaxial layer;

c) defining a body contact area by removing a portion of the first epitaxial layer and the second epitaxial layer;

d) forming a third epitaxial layer at least in the body contact area;

e) removing the first epitaxial layer; and f) forming the buried isolation layer in or near a space provided by removing the first epitaxial layer, the buried isolation layer being a dielectric layer formed by an oxidation process;

forming in the substrate a first electrode of the trench capacitor at least in areas surrounding a lower portion of the trench;

forming a dielectric layer of the trench capacitor, the dielectric layer covering a surface of the trench at least for the portion below the buried isolation layer; and forming a second electrode of the trench capacitor in the trench.

2. The method of claim 1, further comprises:

forming a conductive plug on top of a portion of the second electrode;

forming a trench isolation region over the second electrode and the conductive plug; and forming a conductive junction in a portion of the substrate to couple the second electrode to a drain area of a transistor.

3. The method of claim 1, wherein forming the first electrode comprises doping at least the areas surrounding the lower portion of the trench to increase the conductivity of the areas.

4. The method of claim 1, wherein forming the first electrode comprises:

forming arsenic silicate glass or phosphosilicate glass on the areas;

diffusing dopants from the arsenic silicate glass or the phosphosilicate glass to the areas; and removing the arsenic silicate glass or the phosphosilicate glass.

5. The method of claim 1, wherein forming the dielectric layer comprises:

forming a silicon nitride layer covering the surface of the trench; and oxidizing the silicon nitride layer.

6. The method of claim 1, wherein forming the second electrode comprises forming a polysilicon layer contiguously with the dielectric layer.

7. A method for forming a trench capacitor in a substrate, the method comprising:

removing a portion of the substrate to form a trench within the substrate;

forming a buried isolation layer within the substrate, the buried isolation layer intersecting with the trench and providing at least one gap for providing body contact in the substrate, the step of forming the buried isolation layer within the substrate further including:

a) forming at least a first epitaxial layer over the substrate;

b) forming at least a second epitaxial layer over the first epitaxial layer;

c) defining a body contact area by removing a portion of the first epitaxial layer and the second epitaxial layer;

d) forming a third epitaxial layer at least in the body contact area;

e) removing the first epitaxial layer; and f) forming the buried isolation layer in or near a space provided by removing the first epitaxial layer, the buried isolation layer being a dielectric layer formed by an oxidation process;

forming in the substrate a first electrode of the trench capacitor at least in areas surrounding a lower portion of the trench;

forming a dielectric layer of the trench capacitor, the dielectric layer covering a surface of the trench at least for the portion below the buried isolation layer;

forming a second electrode of the trench capacitor in the trench;

forming a conductive plug on top of a portion of the second electrode;

forming a trench isolation region over the second electrode and the conductive plug; and forming a conductive junction in a portion of the substrate to couple the second electrode to a drain area of a transistor.

8. The method of claim 7, wherein forming the first electrode comprises doping at least the areas surrounding the lower portion of the trench to increase the conductivity of the areas.

9. The method of claim 7, wherein forming the first electrode comprises:

forming arsenic silicate glass or phosphosilicate glass on the areas;

diffusing dopants from the arsenic silicate glass or the phosphosilicate glass to the areas; and removing the arsenic silicate glass or the phosphosilicate glass.

10. The method of claim 7, wherein forming the dielectric layer comprises forming a silicon nitride layer covering the surface of the trench; and oxidizing the silicon nitride layer.

11. The method of claim 7, wherein forming the second electrode comprises forming a polysilicon layer contiguously with the dielectric layer.

* * * * *